(12) United States Patent
Castex et al.

(10) Patent No.: US 11,637,542 B2
(45) Date of Patent: Apr. 25, 2023

(54) HETEROSTRUCTURE AND METHOD OF FABRICATION

(71) Applicant: Soitec, Bernin (FR)

(72) Inventors: Arnaud Castex, Grenoble (FR); Daniel Delprat, Crolles (FR); Bernard Aspar, Saint-Ismier (FR); Ionut Radu, Crolles (FR)

(73) Assignee: Soitec, Bernin (FR)

( * ) Notice: Subject to any disclaimer, the term of this patent is extended or adjusted under 35 U.S.C. 154(b) by 175 days.

(21) Appl. No.: 17/075,465

(22) Filed: Oct. 20, 2020

(65) Prior Publication Data
US 2021/0058058 A1     Feb. 25, 2021

Related U.S. Application Data

(63) Continuation of application No. 16/877,309, filed on May 18, 2020, now Pat. No. 11,595,020, which is a (Continued)

(30) Foreign Application Priority Data

Jun. 12, 2015   (FR) ..................... 1501222

(51) Int. Cl.
*H03H 9/02* (2006.01)
*H01L 41/08* (2006.01)
(Continued)

(52) U.S. Cl.
CPC ..... *H03H 9/02834* (2013.01); *H01L 41/0805* (2013.01); *H01L 41/1873* (2013.01);
(Continued)

(58) Field of Classification Search
CPC .. H03H 9/02834; H03H 3/10; H03H 9/02574; H03H 3/04; H03H 9/6496;
(Continued)

(56) References Cited

U.S. PATENT DOCUMENTS

| 5,759,753 A | 6/1998 | Namba et al. |
| 5,982,010 A | 11/1999 | Namba et al. |

(Continued)

FOREIGN PATENT DOCUMENTS

| CN | 102341900 A | 2/2012 |
| CN | 103703793 A | 4/2014 |

(Continued)

OTHER PUBLICATIONS

European Communication pursuant to Article 94(3) EPC for European Application No. 16728029, dated Jul. 28, 2020, 4 pages.
(Continued)

*Primary Examiner* — Rakesh B Patel
*Assistant Examiner* — Jorge L Salazar, Jr.
(74) *Attorney, Agent, or Firm* — TraskBritt

(57) ABSTRACT

The present invention relates to a heterostructure, in particular, a piezoelectric structure, comprising a cover layer, in particular, a layer of piezoelectric material, the material of the cover layer having a first coefficient of thermal expansion, assembled to a support substrate, the support substrate having a second coefficient of thermal expansion substantially different from the first coefficient of thermal expansion, at an interface wherein the cover layer comprises at least a recess extending from the interface into the cover layer, and its method of fabrication.

23 Claims, 5 Drawing Sheets

Related U.S. Application Data continuation of application No. 15/735,477, filed as application No. PCT/EP2016/063198 on Jun. 9, 2016, now Pat. No. 10,826,459.

(51) Int. Cl.

| | | |
|---|---|---|
| *H03H 3/04* | (2006.01) | |
| *H03H 9/64* | (2006.01) | |
| *H01L 41/312* | (2013.01) | |
| *H01L 41/313* | (2013.01) | |
| *H01L 41/187* | (2006.01) | |
| *H03H 3/10* | (2006.01) | |
| *H01L 41/47* | (2013.01) | |
| *H01L 41/332* | (2013.01) | |
| *H01L 41/337* | (2013.01) | |

(52) U.S. Cl.
CPC .......... *H01L 41/312* (2013.01); *H01L 41/313* (2013.01); *H03H 3/04* (2013.01); *H03H 3/10* (2013.01); *H03H 9/02574* (2013.01); *H01L 41/332* (2013.01); *H01L 41/337* (2013.01); *H01L 41/47* (2013.01); *H03H 9/6496* (2013.01); *Y10T 29/42* (2015.01)

(58) Field of Classification Search
CPC ............. H01L 41/0805; H01L 41/1873; H01L 41/312; H01L 41/313; H01L 41/332; H01L 41/337; H01L 41/47; H01L 41/18; Y10T 29/42
USPC .................. 333/133, 186, 187, 188, 193–196
See application file for complete search history.

(56) References Cited

U.S. PATENT DOCUMENTS

| | | | |
|---|---|---|---|
| 8,664,747 B2 | 3/2014 | Cui | |
| 2003/0193105 A1* | 10/2003 | Montgomery | B29C 45/73 264/328.2 |
| 2010/0308455 A1 | 12/2010 | Kim et al. | |
| 2011/0050034 A1* | 3/2011 | Yamane | H03H 9/0222 310/313 C |
| 2011/0127581 A1 | 6/2011 | Bethoux et al. | |
| 2012/0018855 A1 | 1/2012 | Colnat | |
| 2012/0024073 A1* | 2/2012 | Guo | G01L 9/0075 73/718 |
| 2013/0294038 A1 | 11/2013 | Landru et al. | |
| 2014/0009032 A1 | 1/2014 | Takahashi et al. | |
| 2014/0139075 A1 | 5/2014 | Iwamoto | |
| 2014/0145558 A1 | 5/2014 | Hori et al. | |
| 2014/0152145 A1 | 6/2014 | Kando et al. | |
| 2014/0159548 A1* | 6/2014 | Burak | H01L 41/053 310/346 |
| 2015/0042210 A1 | 2/2015 | Nagareda et al. | |
| 2017/0059378 A1 | 3/2017 | Nagareda et al. | |
| 2018/0233400 A1 | 8/2018 | Wang et al. | |
| 2020/0021272 A1 | 1/2020 | Segovia et al. | |

FOREIGN PATENT DOCUMENTS

| | | | |
|---|---|---|---|
| CN | 103765773 A | 4/2014 | |
| EP | 0755085 A1 | 1/1997 | |
| FR | 2942911 A1 | 9/2010 | |
| JP | 09-092895 A | 4/1997 | |
| JP | 2005-347295 A | 12/2005 | |
| JP | 2012-519974 A | 8/2012 | |
| KR | 10-2001-0113684 A | 12/2001 | |
| KR | 10-0945800 B1 | 3/2010 | |
| KR | 10-2011-0105860 A | 9/2011 | |
| WO | 2010/102686 A1 | 9/2010 | |
| WO | 2014/002286 A1 | 1/2014 | |

OTHER PUBLICATIONS

Japanese Notice of Reasons for Refusal for Japanese Application No. 2018-514308, dated Feb. 12, 2019, 18 pages with English Translation.
Korean Notice of Preliminary Rejection for Korean Application No. 10-2020-7007038, dated Mar. 31, 2020, 66 pages.
Korean Notice of Rejection for Korean Application No. 10-2017-07036949 dated Dec. 27, 2019.
Korean Notification of Reason for Refusal for Korean Application No. 10-2017-7036949, dated Jun. 21, 2019, 12 pages with English Translation.
Korean Notice of Decision of Rejection for Korean Application No. 10-2020-7007038, dated Nov. 27, 2020, 7 pages with English translation.
Korean Notice of Decision of Rejection for Korean Application No. 10-2020-7007038, dated Oct. 19, 2020, 7 pages including English translation.
Korean Notice of Preliminary Rejection for Application No. 10-2020-7007038 dated Feb. 25, 2021, 4 pages.
Korean Notice of Preliminary Rejection for Application No. 10-2020-7036755 dated Feb. 25, 2021, 4 pages.
Korean Written Decision on Registration for Korean Application No. 10-2020-7007038, dated Jul. 23, 2021, 4 pages with 2 pages of English Translation and 2 pages of Original Document.
Chinese First Notification of Office Action for Chinese Application No. 201680033898.X dated Aug. 5, 2019, 6 pages.
Chinese Search Report for Chinese Application No. 201680033898, dated Jul. 25, 2019, 1 page.
European Office Action for European Application No. 16728029.6 dated Nov. 8, 2018, 4 pages.
French Office Action for French Application No. 1501222 dated May 20, 2016, 7 pages.
Hashimoto et al., Recent development of temperature compensated SAW devices.Ultrasonics Symposium 2011, IEEE International, pp. 79-86, abstract only.
International Search Report for International Application No. PCT/EP2016/063198 dated Aug. 29, 2016, 3 pages.
International Written Opinion for International Application No. PCT/EP2016/063198 dated Aug. 29, 2016, 5 pages.
Japanese Decision of Refusal for Japanese Application No. 2017-563155, dated Aug. 26, 2019, 6 pages with English Translation.
Japanese Final Rejection for Japanese Application No. 2017-563155 dated Aug. 26, 2019, 3 pages.
Japanese Office Action for Japanese Application No. 2017-563155 dated Feb. 12, 2019, 19 pages.
Japanese Search Report for Japanese Application No. 2018-514308, dated Feb. 6, 2019, 19 pages with English Translation.
Japanese Written Opinion for Japanese Application No. 2017-563155, dated May 17, 2019, 6 pages with English Translation.
Korean Notice of Final Rejection for Application No. 10-2017-7036949, dated Feb. 11, 2020, 4 pages with English Translation.
Korean Notice of Final Rejection for Korean Application No. 10-2017-7036949, dated Dec. 27, 2019, 7 pages with English Translation.
Korean Notice of Preliminary Rejection for Korean Application No. 10-2017-7036949 dated Jun. 21, 2019, 51 pages.

* cited by examiner

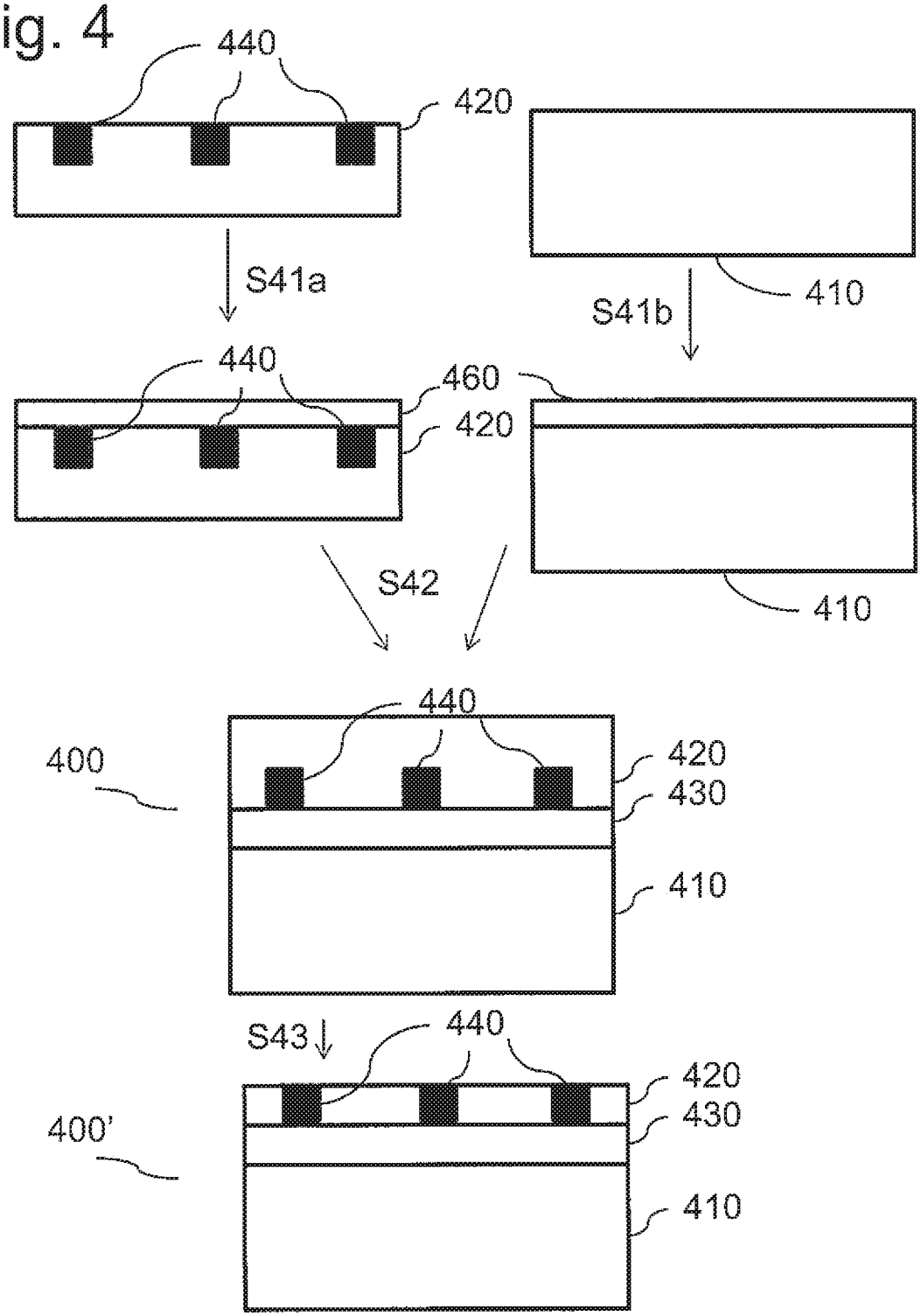

HETEROSTRUCTURE AND METHOD OF FABRICATION

CROSS-REFERENCE TO RELATED APPLICATIONS

This application is a continuation of U.S. patent application Ser. No. 16/877,309, filed May 18, 2020, now U.S. Pat. No. 11,595,020, issued Feb. 28, 2023, which is a continuation of U.S. patent application Ser. No. 15/735,477, filed Dec. 11, 2017, now U.S. Pat. No. 10,826,459, issued on Nov. 3, 2020, which application is a national phase entry under 35 U.S.C. § 371 of International Patent Application PCT/EP2016/063198, filed Jun. 9, 2016, designating the United States of America and published in English as International Patent Publication WO 2016/198542 A1 on Dec. 15, 2016, which claims the benefit under Article 8 of the Patent Cooperation Treaty to French Patent Application Serial No. 15/01222, filed Jun. 12, 2015, the disclosure of each of which is incorporated herein within its entirety by this reference.

TECHNICAL FIELD

The present disclosure generally relates to a heterostructure, in particular, to a piezoelectric structure and a method of fabrication of a heterostructure, in particular, of a piezoelectric structure.

BACKGROUND

The objective of the disclosure is to propose a heterostructure, in particular, a piezoelectric structure, and a method of fabrication of a heterostructure, in particular, of a piezoelectric structure.

Radio frequency (RF) surface acoustic wave (SAW) technology is widely used in a large variety of applications such as, for instance, duplexers in current mobile phones. Further improvement of the standard SAW technology has led to the development of temperature-compensated SAW devices in order to stay competitive with RF bulk acoustic wave (BAW) technology.

Temperature-compensated SAWs may be obtained within a piezoelectric structure 100 comprising a layer of piezoelectric material 120 assembled to a support substrate 110, optionally with an adhesive layer 130 in between, as shown schematically in FIG. 1A. Recent development of temperature-compensated SAW devices have been reviewed in a recent publication by Hashimoto et al., "Recent development of temperature compensated SAW devices," *Ultrasonics Symposium 2011, IEEE International*, pages 79-86, and illustrate in more detail the approach of FIG. 1A. The support substrate 110 has thereby a stiffening function of the piezoelectric structure 100.

However, such a piezoelectric structure 100 as shown schematically in FIG. 1A may not be suitable to withstand thermal treatments due to the substantial difference in the respective coefficients of thermal expansion (CTE) of the layer of piezoelectric material 120 and the support substrate 110. Such CTE mismatch might be, in the worst case, the cause of breakage of such structure for temperatures higher than a predetermined threshold. Other phenomena can occur, such as, for instance, buckling in the layer of piezoelectric material 120. Further, the bow of the piezoelectric structure 100 might exceed critical values upon thermal treatments, such as, for instance, the value above which electrostatic chucks might lose contact to the structure. In addition, the strong anisotropy in CTE for most piezoelectric materials renders thermal treatments difficult due to the buildup of anisotropic strain.

FIG. 1B schematically shows an approach disclosed in U.S. Pat. No. 8,664,747, whereby recesses 140 have been formed on the face of the structure 100' opposed to the face of the layer of piezoelectric material 120' assembled to the substrate 110'. Such formation of recesses in a layer of piezoelectric material 120' formed on a substrate 110' having a CTE substantially different from the layer of piezoelectric material 120' can help to accommodate stress built up in such structure 100'.

However, several problems are encountered using such an approach. One has to pay attention in order to not damage the underlying interface to the substrate 110', particularly for a layer of piezoelectric material 120' with relatively low thickness in the range of 1-10 μm. Imprecise methods such as, for instance, sawing, may lead to damage of either the substrate 110' in the surface region of the latter, leaving behind nucleation sites for breakage, or the adhesive layer (not shown in FIG. 1B). This is, in particular, detrimental to the structure 100' if subsequent lithography and etching steps are involved, which could cause substantial underetching of the layer of piezoelectric material 120'. Further, the substrate 110' might have at its surface to be assembled a functional layer that should not be altered in order to not lose its specific properties.

This present disclosure addresses the above-mentioned problems.

BRIEF SUMMARY

In particular, the present disclosure relates to a heterostructure, in particular, a piezoelectric structure, comprising a cover layer, in particular, a layer of piezoelectric material, the cover layer having a first coefficient of thermal expansion, assembled to a support substrate, the support substrate having a second coefficient of thermal expansion substantially different from the first coefficient of thermal expansion, at an interface wherein the cover layer comprises at least a recess extending from the interface into the cover layer.

Further advantageous embodiments relate to a heterostructure wherein the at least a recess forms a trench extending over the entire cover layer.

Further advantageous embodiments relate to a heterostructure wherein parts of the cover layer separated by the at least a recess have a lateral dimension smaller than a predetermined critical length above which breakage due to a thermal treatment at a predefined temperature would occur.

Further advantageous embodiments relate to a heterostructure wherein the at least a recess extends to the surface of the cover layer opposed to the interface to the support substrate.

Further advantageous embodiments relate to a heterostructure wherein at least one of the coefficients of thermal expansion shows strong anisotropy.

Further advantageous embodiments relate to a heterostructure wherein the material of the cover layer is a piezoelectric material, in particular, chosen among LTO, LNO, AlN, and ZnO.

Further advantageous embodiments relate to a heterostructure wherein the material of the support substrate is chosen among the group of Si, Ge, GaAs, InP, SiGe, and sapphire.

Further advantageous embodiments relate to a heterostructure wherein the support substrate comprises a functional layer adjacent to the interface.

Further advantageous embodiments relate to a heterostructure wherein the functional layer provides the support substrate with electrical resistivity higher than 1 kOhm/cm, preferentially higher than 5 kOhm/cm.

Further advantageous embodiments relate to a heterostructure wherein the functional layer has a thickness below 10 µm, preferentially below 1 µm, or even more preferentially below 100 nm.

This disclosure also relates to a method of fabrication of a heterostructure comprising a step of providing a support substrate and providing a cover layer, in particular, a layer of piezoelectric material, a step of forming at least a recess in a surface of the cover layer, and a step of assembling the support substrate and the cover layer at an assembling interface between the support substrate and the surface of the cover layer comprising the at least a recess.

Further advantageous embodiments relate to a method of fabrication of a heterostructure further comprising a thinning step of the surface of the cover layer opposite the assembling interface.

Further advantageous embodiments relate to a method of fabrication of a heterostructure wherein the thinning step comprises a step of implanting atomic or ionic species, in particular, H or He, prior to assembling, to form a zone of weakness in the cover layer, and a step of exfoliation at the zone of weakness after assembling.

Further advantageous embodiments relate to a method of fabrication of a heterostructure wherein the thinning is performed by a technique chosen among the group of grinding, polishing, etching, or any combination thereof.

Further advantageous embodiments relate to a method of fabrication of a heterostructure wherein the thinning step exposes the at least a recess.

BRIEF DESCRIPTION OF THE DRAWINGS

The disclosure will be provided in more detail hereinafter, by way of example, using advantageous embodiments and with reference to the drawings. The described embodiments are only possible configurations in which the individual features may, however, be implemented independently of each other or may be omitted.

FIG. 4 schematically illustrates a fabrication method of a heterostructure in accordance with embodiments of the present disclosure.

DETAILED DESCRIPTION

The present disclosure will now be described with reference to specific embodiments. It will be apparent to the skilled person that features and alternatives from any of the embodiments can be combined, independently of each other, with features and alternatives of any other embodiment in accordance with the scope of the claims.

Embodiments of the present disclosure are described in relation to a piezoelectric structure and a layer of piezoelectric material. However, as already pointed out above, this disclosure is not limited to this particular embodiment but is related to any heterostructure (200, 400, 400', 500') comprising a cover layer (220, 320, 420, 520) and a support substrate (210, 410, 510) with the coefficient of thermal expansion of the cover layer being substantially different from the one of the support substrate. Such heterostructure encompasses the specific embodiment of a piezoelectric structure identifiable as a heterostructure with the layer of piezoelectric material identifiable as the above-mentioned cover layer. The present disclosure also relates to a method of fabrication of such a heterostructure (200, 400, 400', 500').

Figure 1A:
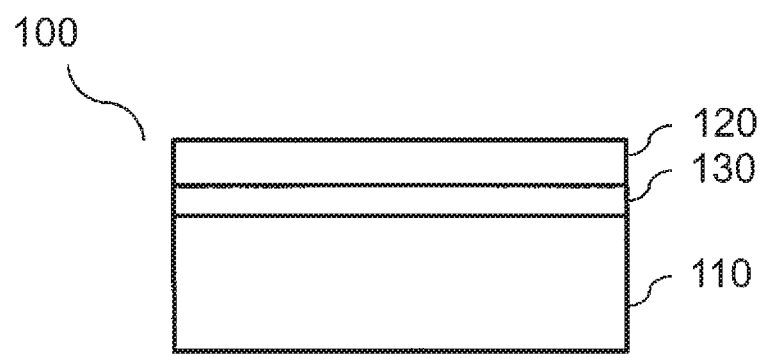
FIG. 1A schematically illustrates a piezoelectric structure for temperature-compensated SAW devices as known from prior art.
Figure 1B:
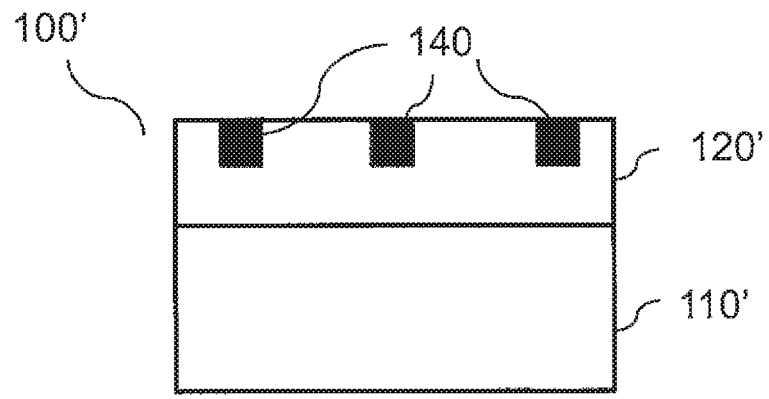
FIG. 1B schematically illustrates a heterostructure for accommodating CTE mismatch as known from prior art.
Figure 2A:
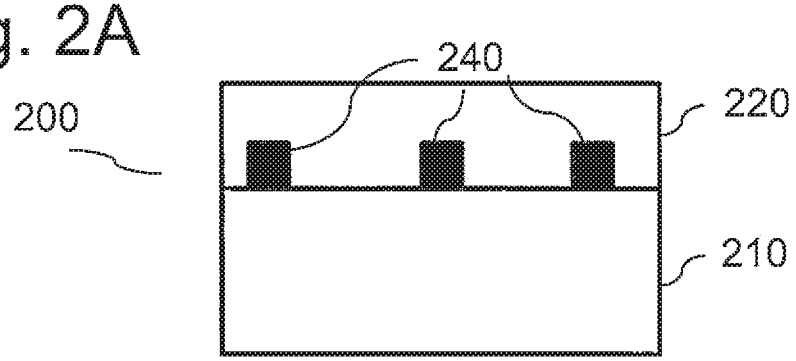
FIGS. 2A, 2B, 2C, and 2D schematically illustrate a heterostructure in accordance with embodiments of the present disclosure.

FIG. 2A schematically shows a piezoelectric structure 200 comprising a layer of piezoelectric material 220, a support substrate 210, and at least one recess 240 extending from the interface at which the layer of piezoelectric material 220 and the support substrate 210 are assembled, into the cover layer of piezoelectric material 220. The cover layer of piezoelectric material 220 has a first coefficient of thermal expansion CTE1 and the support substrate 210 has a second coefficient of thermal expansion CTE2, which is substantially different from the first coefficient of thermal expansion, that is the relation Max(CTE1;CTE2)>Min(CTE1;CTE2) holds, in particular, specified as Max(CTE1;CTE2)/Min(CTE1;CTE2)>2, preferentially >4 or >6 holds, whereby Max(CTE1;CTE2) and Min(CTE1;CTE2) are the highest and lowest value of both CTE1 and CTE2, respectively. This is also applicable in the case of anisotropic CTE values in order to calculate the highest mismatch in CTE.

The at least one recess 240 may be formed by well-known techniques such as, for instance, masking and etching (involving lithography), or even sawing, depending on the precision needed to define the recess. The lateral dimension of the at least one recess 240 may be easily defined comprised in the range from 100 µm up to 5 mm, the depth profile may be controlled in the range from 0.5 µm up to 50 µm, depending on the chemistry, etching rates, and etching duration, for example. Sawing as low-cost alternative easily achieves 1 to 2 mm wide trenches with depth profiles controlled with several µm uncertainty. In the case of layer transfer (for instance, SMART CUT®) as detailed further below, laying open of the at least one recess can be achieved by adjusting the thickness of the layer to be transferred in a range smaller than the depth profile of the at least one recess.

In the case of a cover layer made of piezoelectric material, the piezoelectric material might be Lithium Tantalate (LTO), Lithium Niobate (LNO), Aluminum Nitride (AlN), Zinc Oxide (ZnO), or others.

The material of the support substrate 210 might be chosen among the group of Si, Ge, SiGe, GaAs, InP, sapphire, or any other substrate notably used in semiconductor industry.

Figure 2B:
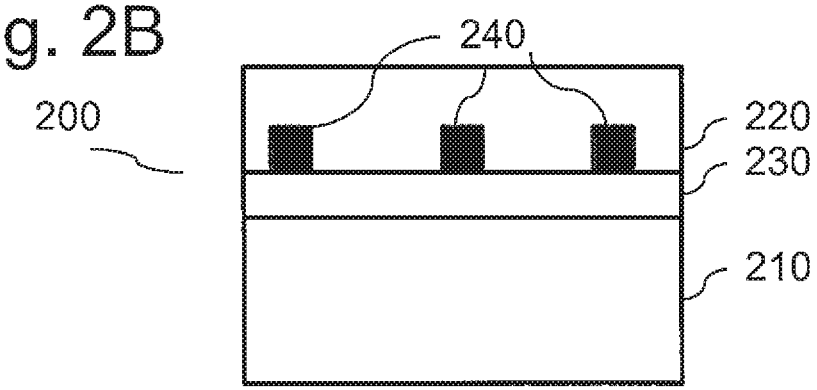

The embodiment schematically disclosed in FIG. 2B differs from the one shown in FIG. 2A in that an adhesive layer 230 is present at the interface in between the layer of piezoelectric material 220 and the support substrate 210. As will be discussed in detail below, the assembly of the layer of piezoelectric material 220 and the support substrate 210 might involve bonding techniques, in particular, molecular bonding, and the adhesive layer 230 might be the bonding interface of two oxide layers, each of which is formed on the layer of piezoelectric material 220 and the support substrate 210 prior to bonding. Other assembly techniques might involve other types of adhesive layers 230 such as, for instance, bonding resins or glues.

Figure 2C:
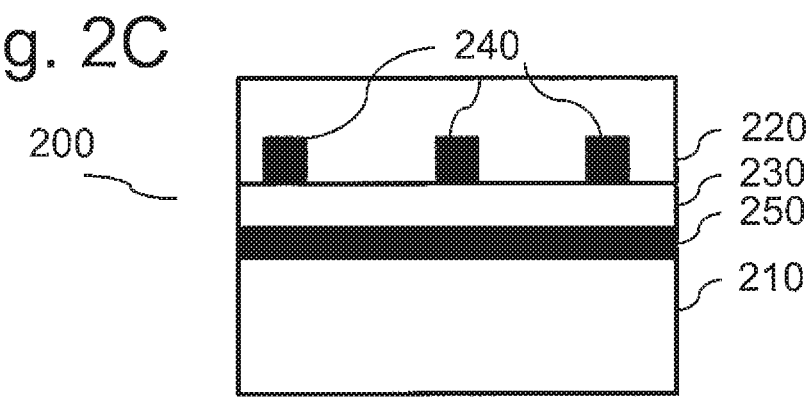

The embodiment schematically depicted in FIG. 2C differs from the one of FIGS. 2A and 2B in that the support substrate 210 comprises a functional layer 250 close to the interface to the layer of piezoelectric material 220. For instance, in the case of a support substrate 210 made of silicon, in particular, a highly resistive silicon substrate with electrical resistivity higher than 1 kOhm/cm or even 5 kOhm/cm, the functional layer 250 might be a so-called trap-rich layer in order to eliminate interface conductive features close to the oxide bonding layers. The trap-rich layer might either be formed as a poly-crystalline silicon layer or by introducing a predetermined porosity level in the functional layer. Such a highly resistive functional layer 250 at the interface is particularly interesting for piezoelectric structures 200 used for SAW devices, for which any electrical loss of signals is detrimental to the device performance. Further, such a functional layer 250 may be used to electrically disconnect or decouple the layer of piezoelectric material 220 from the support substrate 210. Such functional layer 250 may have a thickness below 10 μm, below 1 μm, or even below 100 nm.

The most prominent material is silicon for the support substrate 210 as it is the most commonly used material in the semiconductor industry. Handling and integration in existing production lines is thus facilitated by using such a silicon support substrate 210. In addition, functional microelectronic devices such as, for instance, CMOS, might be integrated in the support substrate 210, and electrically connected (electrical vias not shown in FIG. 2D) where necessary with the piezoelectric devices by traversing the highly resistive functional layer 250, leading to a highly compact device structure with minimized cross-talk.

Figure 2D:
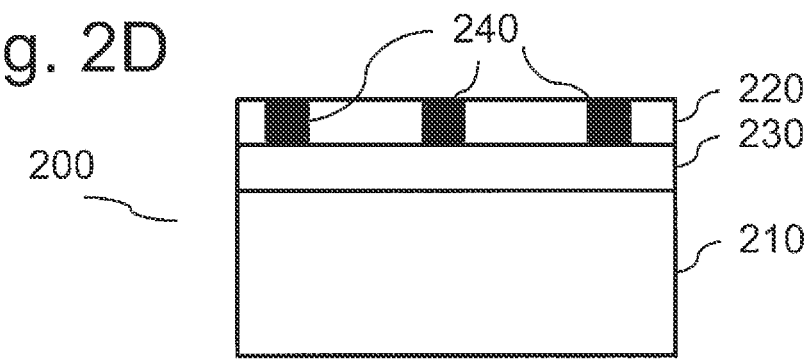

The embodiment schematically disclosed in FIG. 2D differs from the ones depicted in FIGS. 2A to 2C in that the at least one recess extends from the interface to the surface of the layer of piezoelectric material 220 opposed to the interface to the support substrate 210. Such configuration further ameliorates the accommodation of stress built up during thermal treatments. However, the active surface of piezoelectric material is reduced due to the laying open of the at least one recess.

The lateral dimension of the at least one recess 240 has to be chosen in order to have sufficient mechanical stability of the piezoelectric structure 200 while increasing the active surface of piezoelectric material.

Figure 3A:
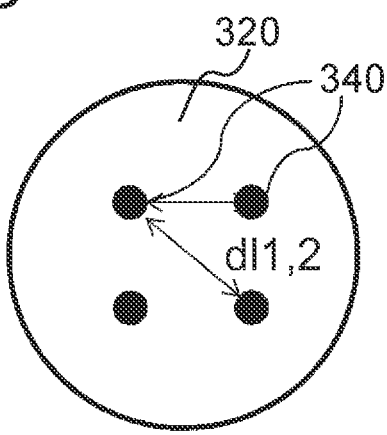
FIGS. 3A, 3B, and 3C schematically illustrate a top view of a heterostructure in accordance with embodiments of the present disclosure.
Figure 3B:
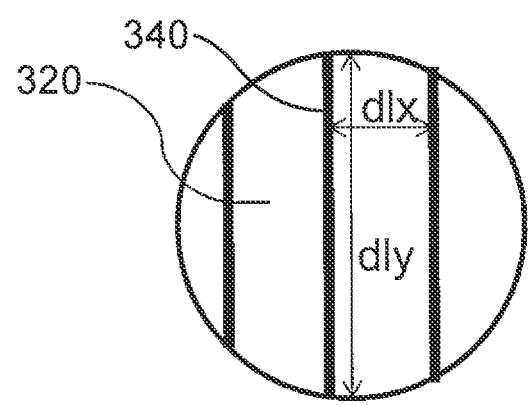
Figure 3C:
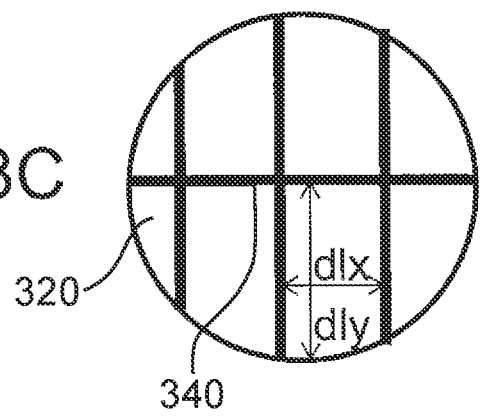

FIGS. 3A through 3C schematically show planar views on wafer level whereby different modes of realization of the at least one recess 340 are represented. In the case where no anisotropy of CTE is present, a configuration as shown in FIG. 3A might be sufficient to suppress the detrimental effects of thermal treatments due to the CTE mismatch. Point-like recess 340 in the layer of piezoelectric layer 320 with a distance di to the nearest and/or second nearest recess are formed at the interface to the support substrate, whereby the distance dl (dl1 for nearest and dl2 for second nearest distance in FIG. 3A) is chosen to be smaller than a predetermined critical length cl. Such critical length cl is defined as being the value above which a thermal treatment at a predetermined temperature would cause detrimental effects. Such detrimental effects would be, for instance, exceeding a critical value for the bow, inducing buckling in the layer of piezoelectric material, or causing breakage of the piezoelectric structure. Whereas handling and bow issues might be controlled, in particular, breakage and buckling should be avoided for temperatures up to 250° C., or even up to 500° C., which correspond to thermal treatments used, for instance, during packaging and front end processing of devices.

FIGS. 3B and 3C schematically show the cases in which strong anisotropy of CTE is present. The at least one recess forms a trench extending over the entire layer of piezoelectric material 320. The distance dlx and dly, respectively, for the main axis x and y, are thereby smaller than the critical length attributed to these main axis x and y, and follow the same criteria as disclosed above in relation to FIG. 3A.

FIG. 4 schematically shows the method of fabrication of the piezoelectric structure 400. The at least one recess 440 is formed in a layer of piezoelectric material 420, for instance, by lithography/masking and etching techniques. The depth of the at least one recess 440 may depend on the stress one wants to accommodate in the piezoelectric structure 400 during a subsequent thermal treatment, and may be in the range from 100 nm up to 20 or even 50 μm. Optionally, the at least one recess 440 is filled with material, for instance, silicon oxide deposited in the recess (i.e., PVD or CVD). This might be advantageous for subsequent bonding or etching applied to such structure. The optional steps S41a and S41b schematically show the providing of a bonding layer 460 on each of the layer of piezoelectric material 420 and the support substrate 410 (however, the present disclosure is not limited to such approach and one might also imagine the use of one bonding layer 460 instead, or even none), for instance a silicon oxide deposited on the respective surfaces. Such bonding layers 460 might be further processed in view of a subsequent assembling step S42, for instance, comprising planarization to minimize the roughness at the bonding interface. The assembling step S42 might be obtained by any kind of bonding techniques, in particular, molecular bonding. The optional bonding layers 460 thereby form the adhesive layer 430. Similar configurations can be obtained by the use of glue or other adhesives such as, for instance, bonding resins. The use of bonding layer 460 at the interface with the layer of piezoelectric material 420 is of particular interest in the case one wants to roughen the interface to the bonding layer 460 while maintaining a high bonding energy at the bonding interface. The roughened interface to the layer of piezoelectric material 420 can be used to avoid so-called ripple effect in the final SAW device.

After assembling the layer of piezoelectric material 420 and the support substrate 410, S43 schematically shows a thinning step of the surface of the layer of piezoelectric material 420 opposite the assembling interface. Such a thinning step S43 might be obtained by a technique, but not limited to, chosen among the group of grinding, polishing, etching, or any combination of these techniques. It is thereby possible to lay the at least one recess open and obtain a piezoelectric structure 400' as shown in FIG. 4 after step S43.

Figure 5:
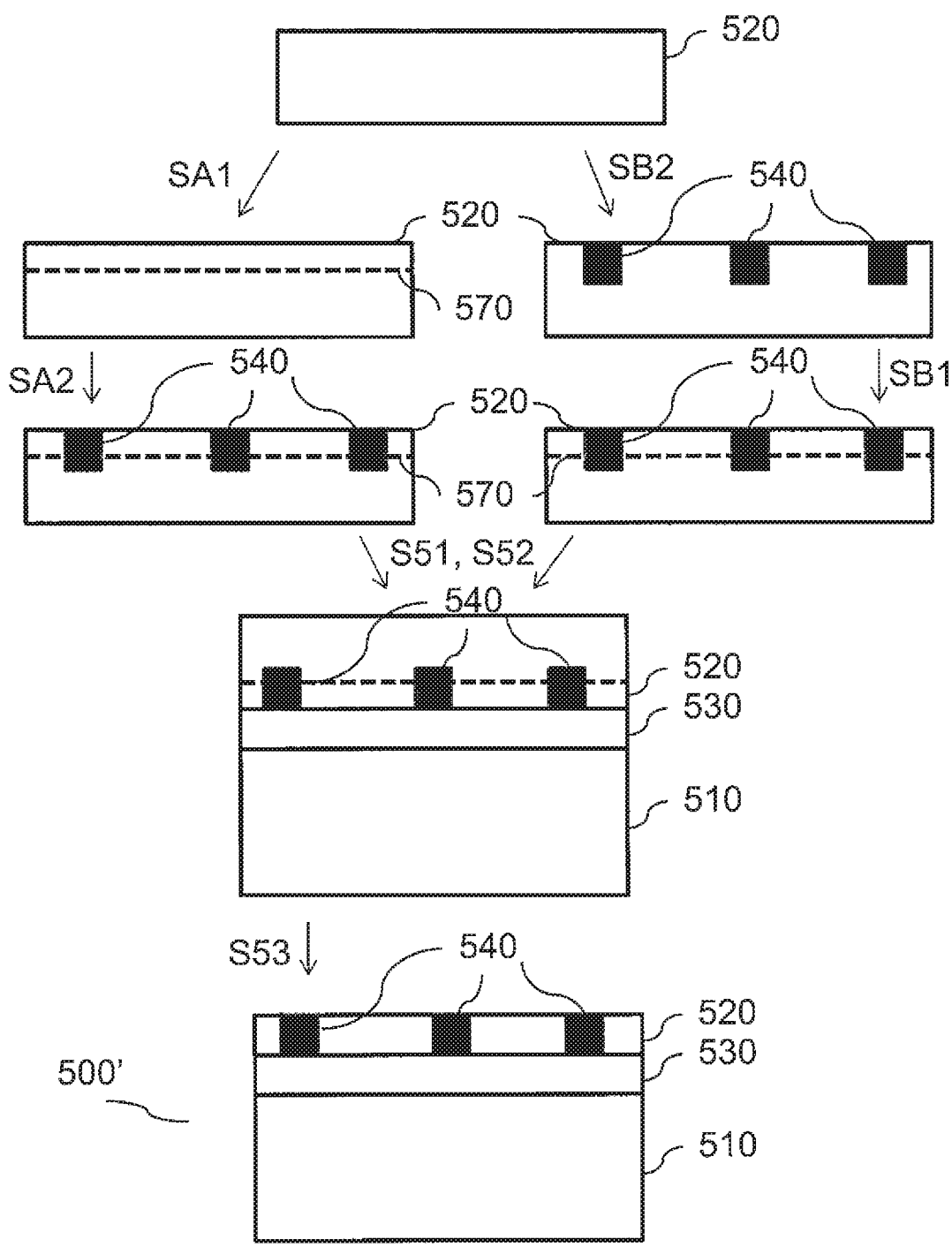
FIG. 5 schematically illustrates a fabrication method of a heterostructure in accordance with embodiments of the present disclosure.

FIG. 5 schematically shows a method of fabrication of a piezoelectric structure 500' wherein the respective thinning step S53 comprises a step of exfoliation at a zone of weakness 570 after assembling the piezoelectric structure 500'. The zone of weakness 570 might be generated by implantation of ionic and/or atomic species, for instance H or He. Such an approach is generally well-known under the term SMART CUT®. FIG. 5 schematically shows that the implantation step can be carried out either before (step SA1) or after (step SB1) formation of the at least one recess 540 (steps SA2 and SB2) in the layer of piezoelectric material 520. Further, FIG. 5 schematically shows the steps of providing the optional adhesive layer 530 in S51, as disclosed in the process flow of FIG. 4, and the step of assembling S52. FIG. 5 then only shows the scenario for which the depth of the at least one recess 540 exceeds the depth of the zone of weakness 570, thus leading to a piezoelectric structure 500' with the at least one recess 540 laid open by the thinning step S53. The present disclosure is not limited to such embodiments, and one can easily adapt the depth in order to obtain final piezoelectric structures according to embodiments shown in FIGS. 2A to 2C, for instance. The thickness of the layer of piezoelectric layer 520 with the recess 540 either laid open or not can be chosen to be in the range from 100 nm up to 1 µm, or even up to 10 µm, or even up to 20 µm.

What is claimed is:

1. A substrate for use in fabricating an acoustic wave device, comprising:
   a support substrate;
   a charge trapping layer on a surface of the support substrate; and
   a piezoelectric material bonded over the charge trapping layer on a side thereof opposite the support substrate along a bonding interface; and
   a layer of adhesive material between the piezoelectric material and the charge trapping layer;
   wherein the bonding interface is located between the piezoelectric material and the charge trapping layer.

2. The substrate of claim 1, wherein the layer of adhesive material comprises a layer of electrically insulating material between the piezoelectric material and the charge trapping layer, and wherein the bonding interface comprises a molecular bonding interface located within or adjacent the layer of electrically insulating material.

3. The substrate of claim 2, wherein the layer of electrically insulating material comprises at least one oxide layer.

4. The substrate of claim 1, wherein the layer of adhesive material comprises resin or glue.

5. The substrate of claim 1, wherein the charge trapping layer electrically disconnects or decouples the piezoelectric material from the support substrate and reduces electrical loss of signals within the piezoelectric material during operation of an acoustic wave device fabricated on the substrate.

6. The substrate of claim 5, wherein the piezoelectric material is lithium tantalate.

7. The substrate of claim 1, wherein the piezoelectric material has a thickness below 10 µm.

8. The substrate of claim 7, wherein the piezoelectric material has a thickness below 1 µm.

9. The substrate of claim 8, wherein the piezoelectric material has a thickness below 100 nm.

10. The substrate of claim 1, wherein the piezoelectric material comprises at least one material selected from among the group consisting of: Lithium Tantalate (LTO), Lithium Niobate (LNO), Aluminum Nitride (AlN), and Zinc Oxide (ZnO).

11. The substrate of claim 1, wherein the charge trapping layer has a thickness below 10 µm.

12. The substrate of claim 1, wherein the support substrate comprises at least one material selected from among the group consisting of: Si, Ge, GaAs, InP, SiGe, and sapphire.

13. The substrate of claim 1, wherein the support substrate has a resistivity higher than 1 kOhm/cm.

14. The substrate of claim 13, wherein the support substrate has a resistivity higher than 5 kOhm/cm.

15. The substrate of claim 1, wherein the piezoelectric material has a first coefficient of thermal expansion, and the support substrate has a second coefficient of thermal expansion different from the first coefficient of thermal expansion.

16. The substrate of claim 15, further comprising at least one recess extending at least partially into the piezoelectric material from a side thereof proximate the support substrate.

17. The substrate of claim 16, wherein the at least one recess comprises a trench.

18. A substrate for use in fabricating an acoustic wave device, comprising:
   a support substrate;
   a charge trapping layer on a surface of the support substrate; and
   a piezoelectric material bonded over the charge trapping layer on a side thereof opposite the support substrate along a bonding interface;
   wherein the bonding interface is located between the piezoelectric material and the charge trapping layer; and
   wherein the charge trapping layer has a thickness below 1 µm.

19. The substrate of claim 18, wherein the charge trapping layer has a thickness below 100 nm.

20. A substrate for use in fabricating an acoustic wave device, comprising:
   a support substrate comprising at least one material selected from among the group consisting of: Si, Ge, GaAs, InP, SiGe, and sapphire;
   a porous and/or polycrystalline trap-rich layer on a surface of the support substrate;
   a piezoelectric material bonded over the porous and/or polycrystalline trap-rich layer on a side thereof opposite the support substrate, the piezoelectric material comprising at least one material selected from among the group consisting of: Lithium Tantalate (LTO), Lithium Niobate (LNO), Aluminum Nitride (AlN), and Zinc Oxide (ZnO); and
   a layer of adhesive material between the piezoelectric material and the porous and/or polycrystalline trap-rich layer.

21. The substrate of claim 20, wherein the piezoelectric material has a thickness below 10 µm, the trap-rich layer has a thickness below 10 µm, and the substrate has a resistivity higher than 1 kOhm/cm.

22. The substrate of claim 20, further comprising at least one recess extending at least partially into the piezoelectric material from a side thereof proximate the support substrate.

23. The substrate of claim 20, wherein the piezoelectric material has a first coefficient of thermal expansion, and the support substrate has a second coefficient of thermal expansion different from the first coefficient of thermal expansion.

* * * * *